US 12,077,865 B2

(12) United States Patent
Yuasa et al.

(10) Patent No.: US 12,077,865 B2
(45) Date of Patent: Sep. 3, 2024

(54) FILM FORMING METHOD AND FILM FORMING APPARATUS

(71) Applicant: Tokyo Electron Limited, Tokyo (JP)

(72) Inventors: Hideki Yuasa, Nirasaki (JP); Hiroyuki Ikuta, Nirasaki (JP); Yutaka Fujino, Nirasaki (JP); Makoto Wada, Nirasaki (JP); Hirokazu Ueda, Osaka (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/820,929

(22) Filed: Aug. 19, 2022

(65) Prior Publication Data

US 2023/0061151 A1 Mar. 2, 2023

(30) Foreign Application Priority Data

Aug. 30, 2021 (JP) .................................. 2021-139582

(51) Int. Cl.
| | |
|---|---|
| C23C 16/00 | (2006.01) |
| C23C 16/34 | (2006.01) |
| C23C 16/56 | (2006.01) |
| H01J 37/32 | (2006.01) |

(52) U.S. Cl.
CPC ............ C23C 16/56 (2013.01); C23C 16/345 (2013.01); *H01J 37/32192* (2013.01)

(58) Field of Classification Search
CPC .................................. C23C 16/00; H01J 21/00
See application file for complete search history.

(56) References Cited

U.S. PATENT DOCUMENTS

| | | | | |
|---|---|---|---|---|
| 2003/0183244 | A1* | 10/2003 | Rossman | B08B 7/0035 134/1.1 |
| 2009/0029498 | A1* | 1/2009 | Yamazaki | C23C 16/511 438/30 |
| 2011/0254078 | A1* | 10/2011 | Honda | H01L 21/02211 438/791 |
| 2021/0143010 | A1* | 5/2021 | Min | C23C 16/4404 |

FOREIGN PATENT DOCUMENTS

| | | | |
|---|---|---|---|
| JP | 2019-216150 A | | 12/2019 |
| KR | 20140001023 A | * | 6/2012 |

OTHER PUBLICATIONS

KR 2014-0001023, English Translated (Year: 2014).*

* cited by examiner

*Primary Examiner* — Kelly M Gambetta
*Assistant Examiner* — Mohammad Mayy
(74) *Attorney, Agent, or Firm* — Armstrong Teasdale LLP

(57) ABSTRACT

A film forming method of forming a film on a substrate by using a film forming apparatus including a processing container, and a stage provided in an interior of the processing container to place the substrate thereon and in which aluminum is contained, includes: forming a film continuously on one substrate or on a plurality of substrates by supplying a gas for film formation to the interior of the processing container while heating the substrate placed on the stage; cleaning the interior of the processing container with a fluorine-containing gas in a state in which the substrate is unloaded from the processing container; and performing a post-process by generating plasma of an oxygen- and hydrogen-containing-gas in the interior of the processing container, wherein the forming the film, the cleaning the interior of the processing container, and the performing the post-process are repeatedly performed.

15 Claims, 9 Drawing Sheets

FILM FORMING METHOD AND FILM FORMING APPARATUS

CROSS-REFERENCE TO RELATED APPLICATION

This application is based upon and claims the benefit of priority from Japanese Patent Application No. 2021-139582, filed on Aug. 30, 2021, the entire contents of which are incorporated herein by reference.

TECHNICAL FIELD

The present disclosure relates to a film forming method and a film forming apparatus.

BACKGROUND

Patent Document 1 discloses that, in a microwave plasma processing apparatus, after performing a film forming process or the like inside a processing container, the interior of the processing container is cleaned by using a $NF_3$ gas excited by plasma.

PRIOR ART DOCUMENT

Patent Document

Patent Document 1: Japanese Laid-Open Publication No. 2019-216150

SUMMARY

According to one embodiment of the present disclosure, there is provided a film forming method of forming a film on a substrate by using a film forming apparatus including a processing container, and a stage provided in an interior of the processing container to place the substrate thereon and in which aluminum is contained, the film forming method includes: forming a film continuously on one substrate or on a plurality of substrates by supplying a gas for film formation to the interior of the processing container while heating the substrate placed on the stage; cleaning the interior of the processing container with a fluorine-containing gas in a state in which the substrate is unloaded from the processing container; and performing a post-process by generating plasma of an oxygen- and hydrogen-containing-gas in the interior of the processing container, wherein the forming the film, the cleaning the interior of the processing container, and the performing the post-process are repeatedly performed.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Film Forming Apparatus>

Figure 1:
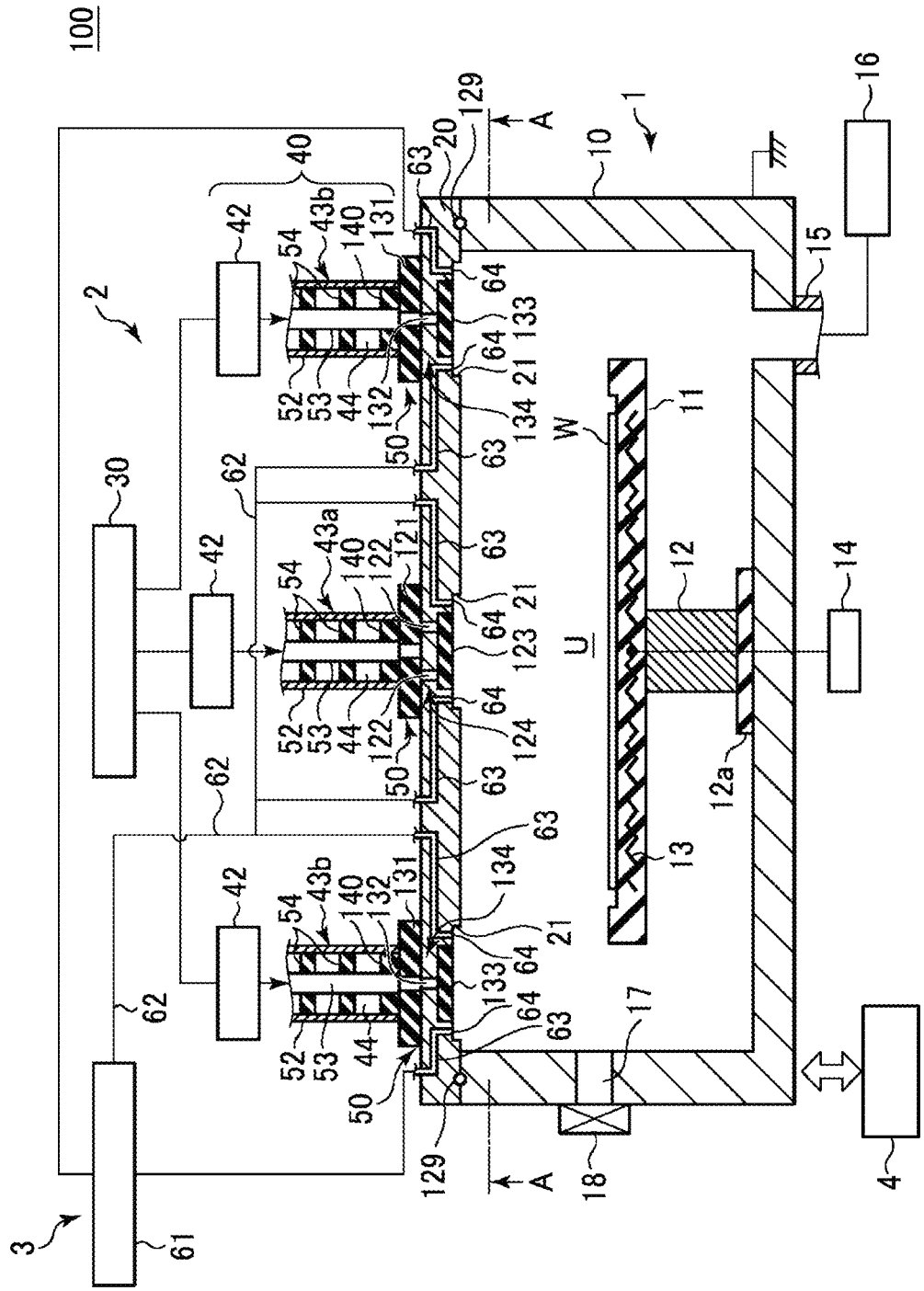
FIG. 1 is a cross-sectional view illustrating an example of a film forming apparatus for executing a film forming method according to an embodiment.
Figure 2:
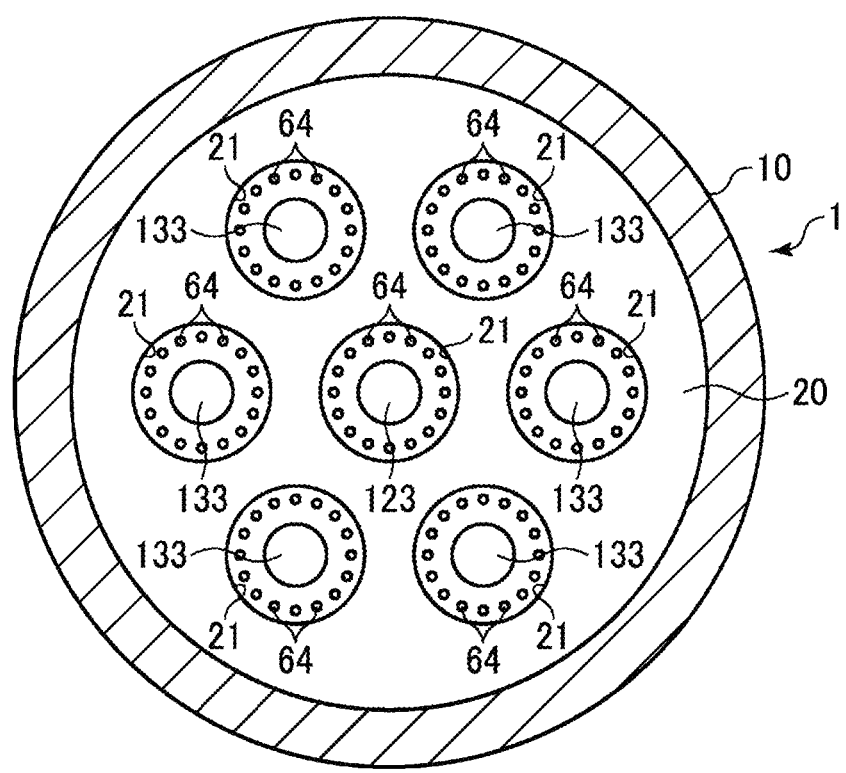
FIG. 2 is a cross-sectional view illustrating a cross section of the film forming apparatus, taken along line A-A in FIG. 1.

FIG. 1 is a cross-sectional view illustrating an example of a film forming apparatus for executing a film forming method according to an embodiment, and FIG. 2 is a cross-sectional view illustrating a cross section of the film forming apparatus, taken along line A-A in FIG. 1.

The film forming apparatus 100 is configured as a plasma processing apparatus that performs plasma processing by microwave plasma.

The film forming apparatus 100 includes a processing container (chamber) 1 that accommodates a substrate W. The film forming apparatus 100 performs a film forming process on the substrate W with surface wave plasma formed in the vicinity of an inner wall surface of a ceiling wall inside the processing container 1 by microwaves radiated into the processing container 1. The film formed by the film forming process is not particularly limited, and may include a Si-containing film such as a silicon nitride film (SiN film) as an example. Although a semiconductor wafer is exemplified as the substrate W, the substrate W is not limited to the semiconductor wafer and may be other substrates such as an FPD substrate or a ceramic substrate.

The film forming apparatus 100 includes a plasma source 2, a gas supply mechanism 3, and a controller 4 in addition to the processing container 1.

The processing container 1 includes a substantially cylindrical container main body 10 having an open upper portion, and a ceiling wall portion 20 that closes the upper opening of the container main body 10. A plasma processing space is formed inside the processing container 1. The container main body 10 is made of a metallic material such as aluminum or stainless steel and is grounded. The ceiling wall portion 20 is made of a metallic material such as aluminum or stainless steel, and has a disk shape. A seal ring 129 is provided on a contact surface between the container main body 10 and the ceiling wall portion 20, whereby the interior of the processing container 1 is airtightly sealed.

A stage 11 on which the substrate W is placed is horizontally provided inside the processing container 1, and is supported by a cylindrical support member 12 provided to stand on the center of the bottom of the processing container 1. The stage 11 is made of an aluminum (Al)-containing material, for example, an aluminum nitride (AlN), which is insulating ceramic. In addition, the material constituting the stage 11 may be alumina ($Al_2O_3$), which is also Al-containing insulating ceramic. The support member 12 may be made of a metal or ceramic. When the support member 12 is made of a metal, an insulating member 12a is provided between the support member 12 and the bottom of the processing container 1. A heater 13 is provided inside the stage 11. A heater power supply 14 is connected to the heater 13. By supplying power from the heater power supply 14 to the heater 13, the stage 11 is heated to an arbitrary temperature up to, for example, 700 degrees C. The stage 11 is provided with three lifting pins (not illustrated) for raising and lowering the substrate W. The substrate W is delivered in a state in which the lifting pins protrude from a front surface of the stage 11. The stage 11 may be provided with an electrostatic chuck for electrostatically attracting the substrate W, a gas flow path for supplying a heat transfer gas to a rear surface of the substrate W, or the like. In addition, the stage 11 may be provided with an electrode. A radio-frequency bias for drawing ions in the plasma may be applied to the electrode.

An exhaust pipe 15 is connected to the bottom of the processing container 1. An exhaust device 16 including a vacuum pump is connected to the exhaust pipe 15. When the exhaust device 16 is operated, the interior of the processing container 1 is exhausted, whereby the interior of the processing container 1 is depressurized to a predetermined degree of vacuum at a high speed. The sidewall of the processing container 1 is provided with a loading/unloading port 17 through which the substrate W is loaded and unloaded, and a gate valve 18 for opening/closing the loading/unloading port 17.

The plasma source 2 is for generating microwaves and radiating the generated microwaves into the processing container 1 to generate plasma, and includes a microwave output part 30, a microwave transmission part 40, and microwave radiation mechanisms 50.

The microwave output part 30 includes a microwave power supply, a microwave oscillator that oscillates microwaves, an amplifier that amplifies the oscillated microwaves, and a distributor that distributes the amplified microwaves to a plurality of paths. Thus, the microwave output part 30 distributes and outputs the microwaves to the plurality of paths.

The microwaves output from the microwave output part 30 are radiated into the processing container 1 through the microwave transmission part 40 and the microwave radiation mechanism 50. A gas is supplied into the processing container 1 as described later. The supplied gas is excited by the introduced microwaves to form surface wave plasma.

The microwave transmission part 40 transmits the microwaves output from the microwave output part 30. The microwave transmission part 40 includes a plurality of amplifiers 42, a central microwave introduction part 43a arranged in the center of the ceiling wall portion 20, and six peripheral microwave introduction parts 43b arranged at equal intervals in the peripheral portion of the ceiling wall portion 20. Each of the plurality of amplifiers 42 amplifies the microwaves distributed by the distributor of the microwave output part 30. The plurality of amplifiers 42 are provided to correspond to the central microwave introduction part 43a and the six peripheral microwave introduction parts 43b, respectively. The central microwave introduction part 43a and the six peripheral microwave introduction parts 43b have a function of introducing the microwaves output from the amplifiers 42, which are provided to correspond thereto, respectively, into the microwave radiation mechanisms 50, and an impedance-matching function.

Each of the central microwave introduction part 43a and the peripheral microwave introduction parts 43b is configured by coaxially arranging a cylindrical outer conductor 52 and a rod-shaped inner conductor 53 provided at the center of the outer conductor 52. Microwave power is supplied to a space between the outer conductor 52 and the inner conductor 53 so that the space forms a microwave transmission path 44 through which microwaves propagate toward the microwave radiation mechanism 50.

Each of the central microwave introduction part 43a and the peripheral microwave introduction parts 43b is provided with a pair of slugs 54 and an impedance adjustment member 140 located at the tip portion thereof. By moving the slugs 54, an impedance of a load (plasma) inside the processing container 1 is matched with a characteristic impedance of a microwave power supply in the microwave output part 30. The impedance adjustment member 140 is made of a dielectric material, and adjusts an impedance of the microwave transmission path 44 by using a relative dielectric constant thereof.

The microwave radiation mechanism 50 includes a slow-wave material 121 (or 131), a slot antenna 124 (or 134) having slots 122 (or 132), and a dielectric member 123 (or 133). The slow-wave materials 121 and 131 are provided at a position corresponding to the central microwave introduction part 43a on the top surface of the ceiling wall portion 20 and at a position corresponding to the peripheral microwave introduction part 43b on the top surface of the ceiling wall portion 20, respectively. In addition, the dielectric members 123 and 133 are provided inside the ceiling wall portion 20 at a position corresponding to the central microwave introduction part 43a and at a position corresponding to the peripheral microwave introduction parts 43b, respectively. The slots 122 and 132 are provided in a portion between the slow-wave material 121 and the dielectric member 123 in the ceiling wall portion 20, and a portion between the slow-wave material 131 and the dielectric member 133 in the ceiling wall portion 20, respectively. The portions where the slots are formed are the slot antennas 124 and 134.

Each of the slow-wave materials 121 and 131 has a disk shape, is arranged to surround the tip portion of the inner conductor 53, has a dielectric constant higher than a vacuum, and is made of, for example, quartz, ceramic, a fluorine-based resin such as polytetrafluoroethylene, or a polyimide-based resin. Each of the slow-wave materials 121 and 131 has a function of making a wavelength of microwaves shorter than that in a vacuum, thereby reducing the size of the antenna. Each of the slow-wave materials 121 and 131 is capable of adjusting a phase of microwaves based on a thickness thereof. The thickness of each of the slow-wave materials 121 and 131 is adjusted such that the slot antennas 124 and 134 become the "antinodes" of standing waves to minimize reflection and to maximize the radiant energy of the slot antennas 124 and 134.

Like the slow-wave materials 121 and 131, each of the dielectric members 123 and 133 is formed of, for example, quartz, ceramic such as alumina ($Al_2O_3$), a fluorine-based resin such as polytetrafluoroethylene, or a polyimide-based resin. Each of the dielectric members 123 and 133 is fitted into a space formed inside the ceiling wall portion 20. A concave window 21 is formed in a portion corresponding to each of the dielectric members 123 and 133 on the bottom surface of the ceiling wall portion 20. Therefore, each of the dielectric members 123 and 133 is exposed inward of the processing container 1 and functions as a dielectric window for supplying microwaves to a plasma generation space U.

The number of peripheral microwave introduction parts 43b and dielectric members 133 is not limited to six, and may be two or more, preferably three or more.

As will be described later, the gas supply mechanism 3 supplies a gas for film formation, a gas for cleaning, and a gas for plasma processing after cleaning into the processing container 1. The gas supply mechanism 3 includes a gas supply part 61, a gas supply pipe 62 through which gas from the gas supply part 61 is supplied, a gas flow path 63 provided in the ceiling wall portion 20, and a plurality of gas discharge ports 64 through which the gas from the flow path 63 is discharged. The plurality of gas discharge ports 64 are provided around the dielectric members 123 and 133 of the windows 21 of the ceiling wall portion 20 (see FIG. 2). The gas supply mechanism 3 is not limited to discharging the gas from the ceiling wall portion 20 as in this example.

The controller 4 controls the operation or processing of each component of the film forming apparatus 100, for example, the supply of the gas from the gas supply mechanism 3, the frequency and output of microwaves of the plasma source 2, the exhaust by the exhaust device 16, and the like. The controller 4 is typically a computer and includes a main controller, an input device, an output device, a display device, and a storage device. The main controller includes a central processing unit (CPU), a RAM, and a ROM. The storage device includes a non-transitory computer-readable storage medium such as a hard disk, and records and reads information necessary for control. In the controller 4, the CPU controls the film forming apparatus 100 by executing a program such as a processing recipe stored in the ROM or the storage medium of the storage device through the use of the RAM as a work area.

<Film Forming Method>

Figure 3:
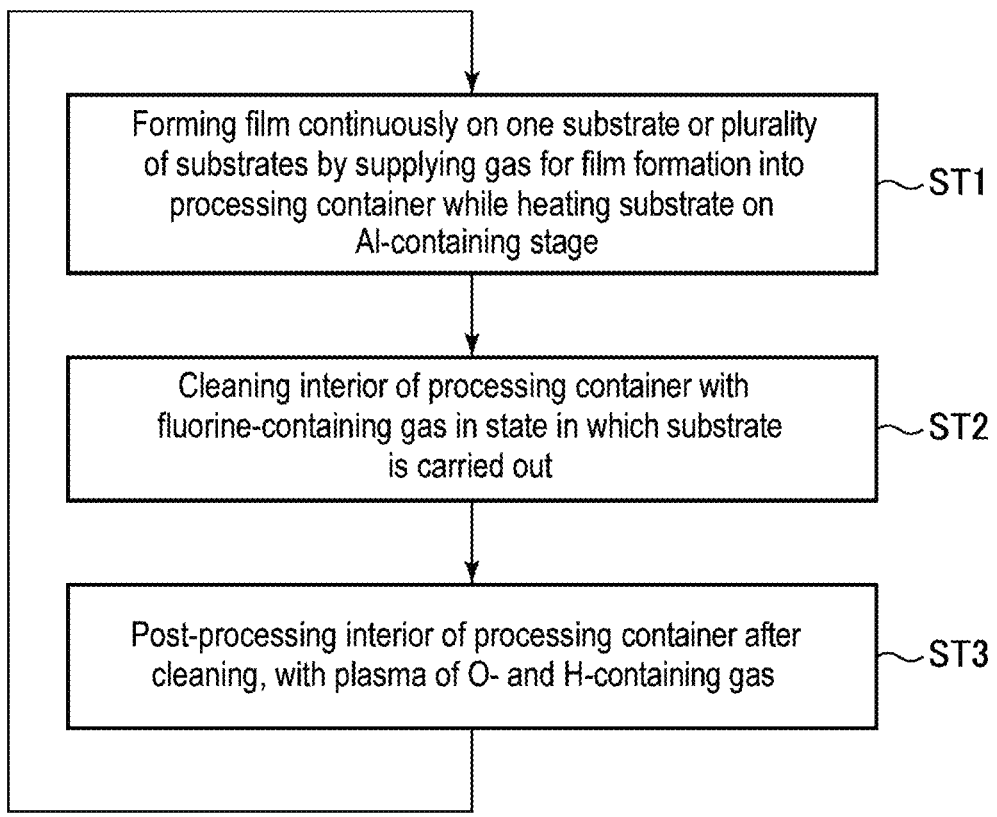
FIG. 3 is a flowchart illustrating the film forming method according to an embodiment.

Next, a film forming method in the film forming apparatus 100 configured as described above will be described. FIG. 3 is a flowchart illustrating the film forming method according to an embodiment.

As illustrated in FIG. 3, in this embodiment, step ST1, step ST2, and step ST3 are repeatedly performed. In step ST1, while heating the substrate W made of an aluminum (Al)-containing material, the gas for film formation is supplied into the processing container 1 to form a film continuously on one substrate W or on a plurality of substrates W. In step ST2, the interior of the processing container 1 is cleaned with a fluorine-containing gas in a state in which the substrate W is unloaded from the processing container 1. In step ST3, the interior of the processing container 1 after the cleaning is post-processed by plasma of an oxygen (O)- and hydrogen (H)-containing gas.

Prior to the film forming step of step ST1, a step of pre-coating the interior of the processing container 1 may be performed. In the pre-coating step, the film formed on the substrate W in step ST1 or a film containing components of the film is deposited inside the processing container 1, for example, on the sidewall of the processing container 1 or the surface of the ceiling wall portion 20, and the front surface of the stage 11. For example, when the film to be formed is a SiN film, the same SiN film as the film formed on the substrate W may be used as a pre-coat film. Other Si-based films such as a SiCN film, a SiON film, and a SiOC film may be used. A temperature or pressure in the pre-coating step may be the same as or lower than that in the film forming step in subsequent step ST1.

In the film forming step of step ST1, film formation is continuously performed on one substrate W or on a plurality of substrates W. The number of the plurality of substrates W may be, for example, about 100. The film to be formed is not particularly limited, but a silicon (Si)-containing film, for example, a SiN film is exemplified as a suitable example. Other Si-containing films such as a SiCN film, a $SiO_2$ film, and a SiON film may be used.

When forming the SiN film, a Si-containing gas and a nitrogen-containing gas may be used as the gas for film formation. As the Si-containing gas, for example, a silane-based compound gas such as a monosilane ($SiH_4$) gas, a disilane ($Si_2H_6$) gas, and a trimethylsilane ($SiH(CH_3)_3$) gas may be used. In addition, as the nitrogen-containing gas, for example, an ammonia ($NH_3$) gas, a nitrogen ($N_2$) gas, or the like may be used. In the case of the SiCN film, as the gas for film formation, a gas obtained by adding a carbon-containing gas to the above-mentioned Si-containing gas and nitrogen-containing gas may be used. As the carbon-containing gas, a hydrocarbon-based gas such as an ethylene ($C_2H_4$) gas, an acetylene ($C_2H_2$) gas, an ethane ($C_2H_6$) gas, a propylene ($C_3H_6$) gas, or a trimethylsilane (($CH_3)_3SiH$) gas may be used. In the case of the $SiO_2$ film, a Si-containing gas and an oxygen-containing gas may be used. As the Si-containing gas, the above-mentioned silane-based compound gas may be used. In addition, as the oxygen-containing gas, for example, an oxygen ($O_2$) gas, a nitric oxide (NO) gas, a nitrous oxide ($N_2O$) gas, or the like may be used. In the case of the SiON film, as the gas for film formation, a gas obtained by adding the above-mentioned nitrogen-containing gas to the above-mentioned Si-containing gas and oxygen-containing gas may be used. In either case, as another gas, an argon (Ar) gas or a helium (He) gas may be used as a diluting gas or a plasma-producing gas.

The film to be formed is not limited to the Si-containing film, and may be, for example, a Ti-based film such as a Ti film or a TiN film, or a carbon film.

In the film forming step of step ST1, first, the gate valve 18 is opened, the substrate W held by a transfer arm (not illustrated) is loaded into the processing container 1 from the loading/unloading port 17 and placed on the stage 11, and the gate valve 18 is closed. At this time, the stage 11 is heated by the heater 13, and the temperature of the substrate W on the stage 11 is controlled. When forming the SiN film as described above, the temperature of the substrate W may be 500 degrees C. or higher. More specifically, the temperature may be 500 to 650 degrees C. Then, the above-mentioned gases are introduced into the processing container 1 depending on the film to be formed, an internal pressure of the processing container 1 is controlled, and the film forming process is performed by plasma CVD. The internal pressure of the processing container 1 may be arbitrarily selected depending on a distance from the plasma source to the substrate W, how the plasma spreads, a film forming rate, a thickness of the film to be formed, or the like. When the film to be formed is a SiN film, the internal pressure may be 266 Pa or less.

In generating plasma, microwaves are output from the microwave output part 30 of the plasma source 2 while introducing gas into the processing container 1. At this time, the microwaves distributed and output from the microwave output part 30 are amplified by the amplifiers 42 of the microwave transmission part 40 and then transmitted to the central microwave introduction part 43a and the peripheral microwave introduction parts 43b. Then, the transmitted microwaves penetrate the slow wave materials 121 and 131 of the microwave radiation mechanisms 50, the slots 122 and 132 of the slot antennas 124 and 134, and the dielectric members 123 and 133 which are microwave transmission windows, and are radiated into the processing container 1. At this time, by moving the slugs 54, the impedance is automatically matched, and the microwaves are supplied in a state in which there is substantially no power reflection. The radiated microwaves propagate on the surface of the ceiling wall portion 20 as surface waves. The gas introduced into the processing container 1 is excited by an electric field of the microwaves, and a surface wave plasma is formed in the plasma generation space U directly below the ceiling wall portion 20 inside the processing container 1. For example, a SiN film is formed on the substrate W through a plasma CVD by this surface wave plasma.

In the film forming apparatus 100 of this embodiment, the substrate W is disposed in a region spaced apart from the plasma generation region, and the plasma diffused from the plasma generation region is supplied to the substrate W, so that the plasma becomes essentially high density plasma at a low electron temperature. Since the electron temperature of the plasma is controlled to be low, it is possible to perform film formation without damaging the formed film or elements of the substrate W, and thus to obtain a high-quality film by high-density plasma. In addition, the film quality is improved as the film forming temperature increases. Therefore, when the film to be formed is a SiN film, a higher quality film may be formed by increasing the film forming temperature to 500 degrees C. or higher as described above.

After forming a film such as the SiN film as described above, the substrate W, which is a substrate, is unloaded from the processing container 1 and the film forming step of step ST1 is completed.

Figure 4:
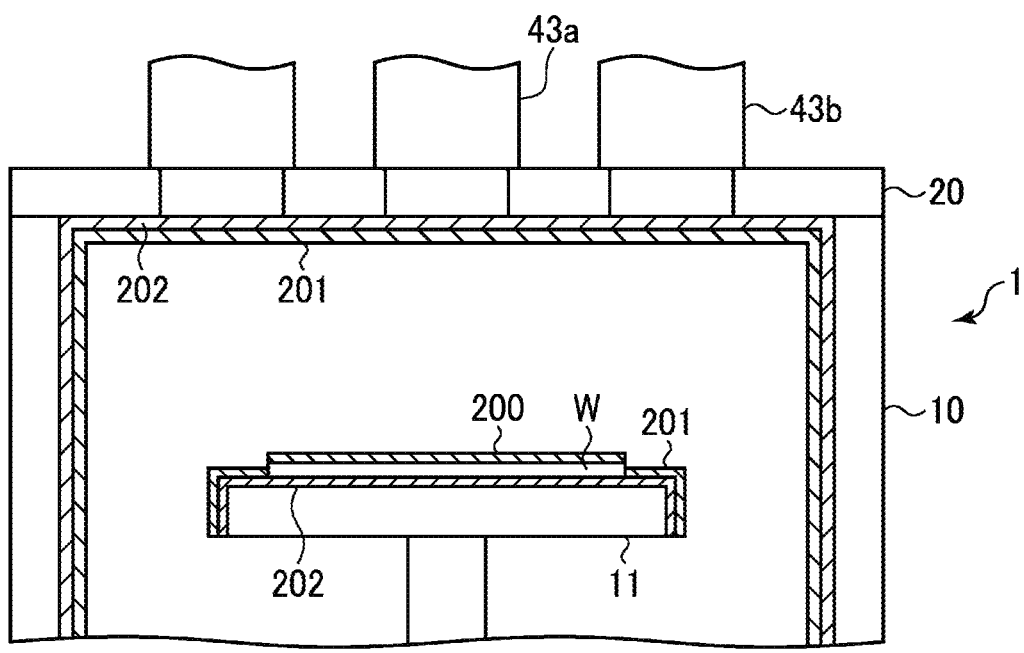
FIG. 4 is a schematic view for explaining a state inside a processing container after a monitor substrate film-forming step.

After the film forming step of step ST1 as described above, the cleaning step of step ST2 is performed. As illustrated in FIG. 4, a deposit 201 having the same components as the film 200 formed on the substrate W is deposited inside the processing container 1 after the film forming step of step ST1. When the pre-coating step is performed, a pre-coat film 202 is deposited under the deposit 201. When a subsequent film formation is performed in the state in which the deposit and the pre-coat film are deposited, particles and the like may be caused. For this reason, the cleaning step is performed prior to the subsequent film formation.

The cleaning step of step ST2 is performed with a fluorine-containing gas. As the fluorine-containing gas, for example, radicals or ions of a $NF_3$ gas excited by plasma may be used. The plasma at this time may be generated by using the plasma source 2 of the film forming apparatus 100, or may be generated by using another plasma source, for example, a remote plasma. The $NF_3$ gas is supplied from the gas supply mechanism 3 into the processing container 1. The $NF_3$ gas may be diluted with an Ar gas or a He gas. In addition, in order to adjust the cleaning speed, a chlorine ($Cl_2$) gas, an $O_2$ gas, a $N_2$ gas, a hydrogen bromide (HBr) gas, a carbon tetrafluoride ($CF_4$) gas, or the like may be added. The $NF_3$ gas excited by plasma may be suitably used, for example, when the film to be formed on the substrate W is a Si-containing film such as a SiN film.

As the fluorine-containing gas used for cleaning, a gas other than the $NF_3$ gas, such as a $F_2$ gas, a CF-based gas, or a $ClF_3$ gas, may be used. The other fluorine-containing gas may not be excited by plasma, and may be diluted with the Ar gas or the He gas. In addition, another additive gas may be added to the fluorine-containing gas. These fluorine-containing gases may be selected depending on a material of the film adhering to and deposited inside the processing container 1.

The internal pressure of the processing container 1 during the cleaning may be basically set arbitrarily depending on a volume of the processing container 1 and how plasma used for the cleaning spreads when the plasma is used. The internal pressure may be in a range of 10 to 1,000 Pa, specifically 400 Pa. As the temperature of the stage 11 during the cleaning, a temperature equal to or lower than the film forming temperature may be used. For example, a temperature in the range of 100 to 600 degrees C. may be used.

Figure 5A:
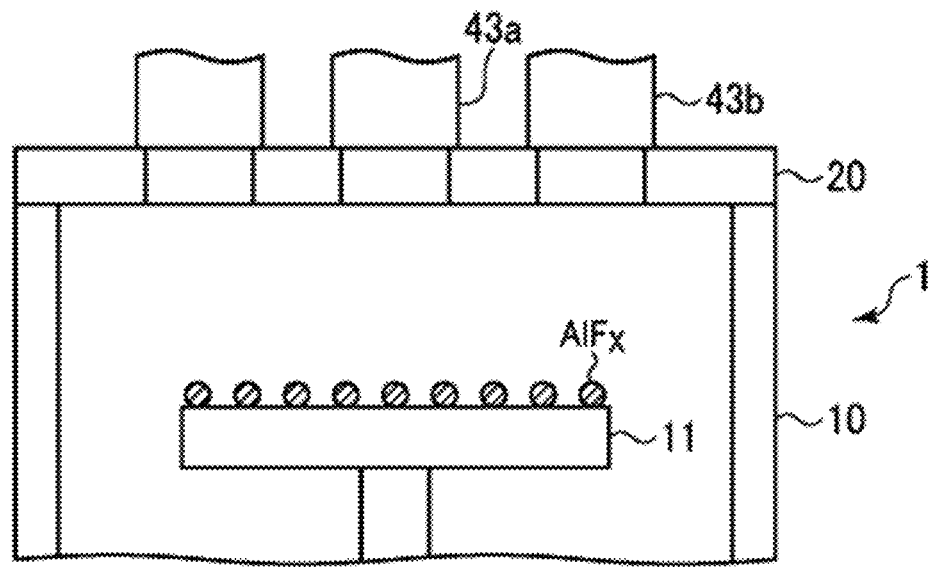
FIGS. 5A to 5C are views for explaining generation of $AlF_x$ during cleaning and an effect of sublimation of the generated $AlF_x$.
Figure 5B:
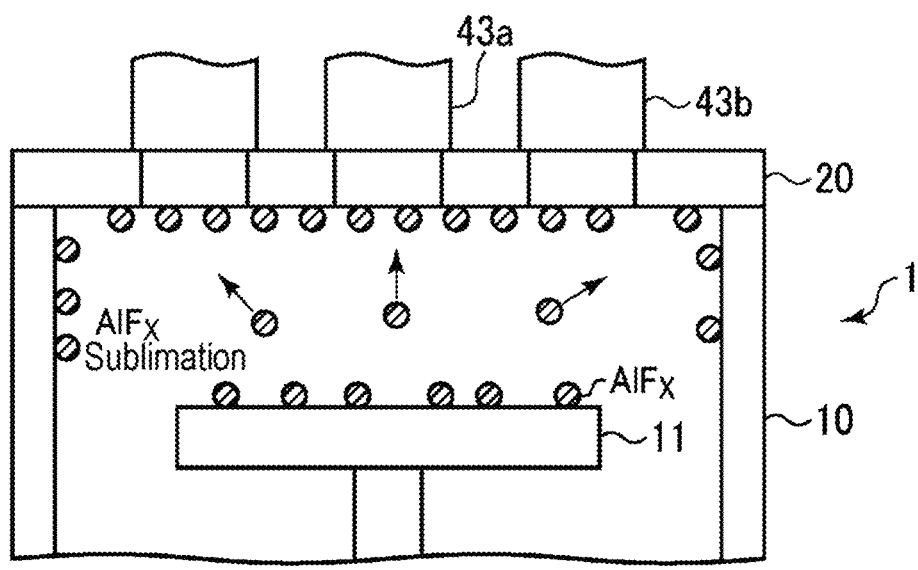
Figure 5C:
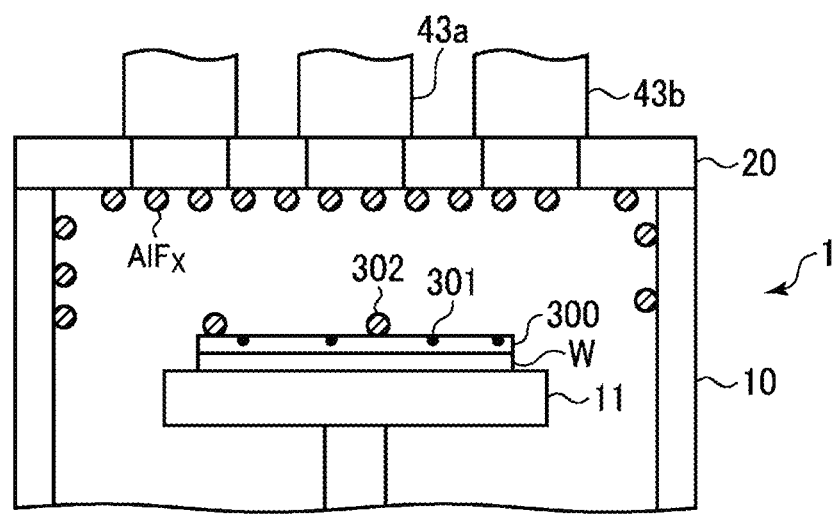

In the cleaning step, when the stage 11 is at a high temperature, the fluorine-containing gas used as the cleaning gas reacts with an Al-containing material such as AlN constituting the stage 11. As a result, as illustrated in FIG. 5A, an aluminum fluoride ($AlF_x$) exemplified by aluminum trifluoride ($AlF_3$) may be unintentionally generated on the front surface of the stage 11. For example, when the $NF_3$ gas excited by plasma is used, $AlF_x$ is generated at 150 degrees C. or higher due to very high reactivity. The higher the temperature, the easier the fluorination reaction to proceed, and the larger the amount of $AlF_x$ generated. Since the interior of the processing container 1 is maintained at a high vacuum, the generated $AlF_x$ is easily sublimated. The sublimated $AlF_x$ diffuses from the front surface of the stage 11 and adheres to and deposits on the inner wall of the processing container 1 having a low temperature, for example, the surface of the ceiling wall portion 20, as illustrated in FIG. 5B. When the $AlF_x$ adheres to and deposits on the inner wall of the processing container 1, it becomes difficult to perform stable and uniform film formation during film formation due to changes in the plasma state and the like, so that a film thickness shift may occur. When the film forming process is performed in the state in which $AlF_x$ adheres to and deposits on the inner wall of the processing container 1, as illustrated in FIG. 5C, $AlF_x$ may be dissociated and mixed as a contaminant 301 into a film 300 which is being formed. This may cause problems such as deterioration of the characteristics of the film 300 and defects. In addition, $AlF_x$ may be turned into particles 302 and fall in the film and on the surface of the film, which has an adverse effect.

Therefore, after the cleaning step, a step of performing a post-process with plasma of an O- and H-containing gas is performed as step ST3. By using the plasma of the O- and H-containing gas in this way, F in the $AlF_x$ generated on the front surface of the stage 11 in the cleaning step is removed, so that it is possible to modify the $AlF_x$ into a stable compound containing Al. As a result, it is possible to suppress sublimation of the $AlF_x$ generated in the cleaning step, in a subsequent film forming step, and thus to suppress the influence of a film thickness shift, contaminants, particles, or the like due to the $AlF_x$ in the film forming step.

Examples of the O- and H-containing gas may include a mixed gas of a $N_2O$ gas and a $H_2$ gas. The O- and H-containing gas may be a mixed gas of an $O_2$ gas, a $N_2$ gas, and a $H_2$ gas. As the O- and H-containing gas, a mixed gas of the $O_2$ gas and the $H_2$ gas may also be used. In addition, the O- and H-containing gas may have been diluted with an Ar gas or a He gas.

The internal pressure of the processing container 1 during the post-process with plasma in step ST3, may be in a range of 6 to 200 Pa, specifically 16 Pa. The temperature of the stage 11 at this time may be a temperature equal to or lower than the film forming temperature. For example, the temperature may be in a range of 100 to 600 degrees C. The temperature of the stage 11 at this time may be the same as the temperature during the cleaning process. As the plasma used in step ST3, the microwave plasma generated by the microwaves supplied from the plasma source 2 may be used as in the film forming process. In addition, the O- and H-containing gas is supplied from the gas supply mechanism 3 into the processing container 1.

In the cleaning step, the generated $AlF_x$ adheres to the stage 11 as a solid at a processing pressure and at a temperature of about 450 degrees C. or lower, and sublimates when the temperature exceeds 450 degrees C. However, the plasma of the O- and H-containing gas in step ST3 may react with both the $AlF_x$ present as a solid and the sublimated $AlF_x$.

Next, the results of experiments on the post-process after the cleaning process will be described.

Figure 6:
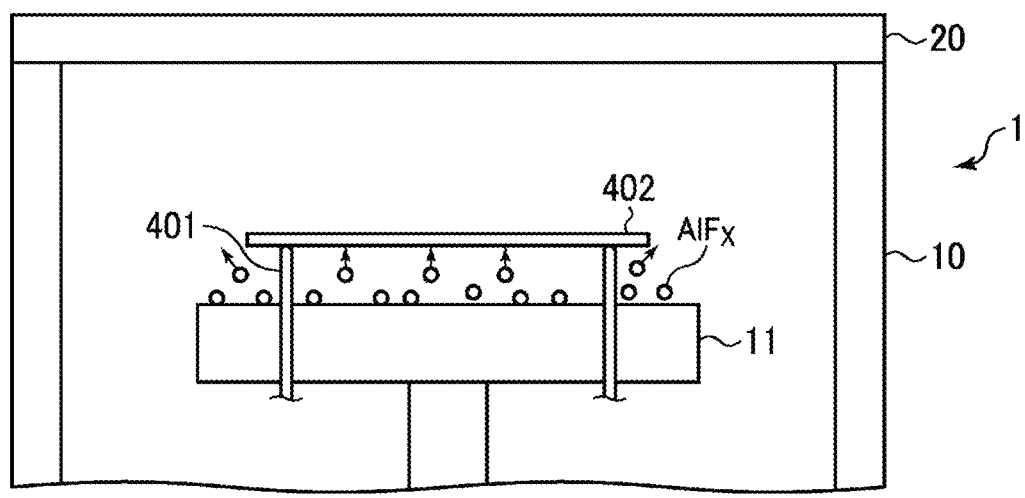
FIG. 6 is a schematic view for explaining a method of measuring an amount of $AlF_3$ sublimated from a stage.

First, by using the film forming apparatus illustrated in FIG. 1, the pre-coating was performed inside the processing container in the state in which the temperature of the stage 11 was set to 450 degrees C., the substrate W was loaded into the processing container to form the SiN film on the substrate W, and then the cleaning process with the $NF_3$ gas excited by plasma and the post-process after cleaning were performed. Here, the post-process includes a process (gas flow) in which the interior of the processing container is kept at 16 Pa, and each of the $N_2$ gas, the $NH_3$ gas, the $N_2O$ gas, the $H_2$ gas, and the $H_2/N_2O$ mixed gas merely flows into the processing container, and a process by plasma of each of these gases, and the time was set to 10 min. As for the plasma conditions, microwave power was set to 3.6 kW. For the $N_2$ gas, the $NH_3$ gas, the $N_2O$ gas, and the $H_2$ gas, the gas flow rate of each single gas was set to 200 sccm. For $H_2/Ar$, the gas flow rate of the $H_2$ gas was set to 100 sccm and the gas flow rate of the Ar gas was set to 200 sccm. For $H_2/N_2O$, the gas flow rates of both the $H_2$ gas and the $N_2O$ gas were set to 200 sccm. After the post-process, a monitor substrate (a monitor wafer) 402 was placed on lifting pins 401 protruding from the upper surface of the stage 11 as illustrated in FIG. 6 while maintaining the temperature of the stage 11 inside the processing container and the internal pressure of the processing container, and the amount of $AlF_3$ sublimated from the stage 11 and adsorbed onto a rear surface of the monitor substrate 402 was measured as an Al contamination amount through total reflection X-ray fluorescence (TXRF) analysis. The measurement time at this time was 30 min.

Figure 7:
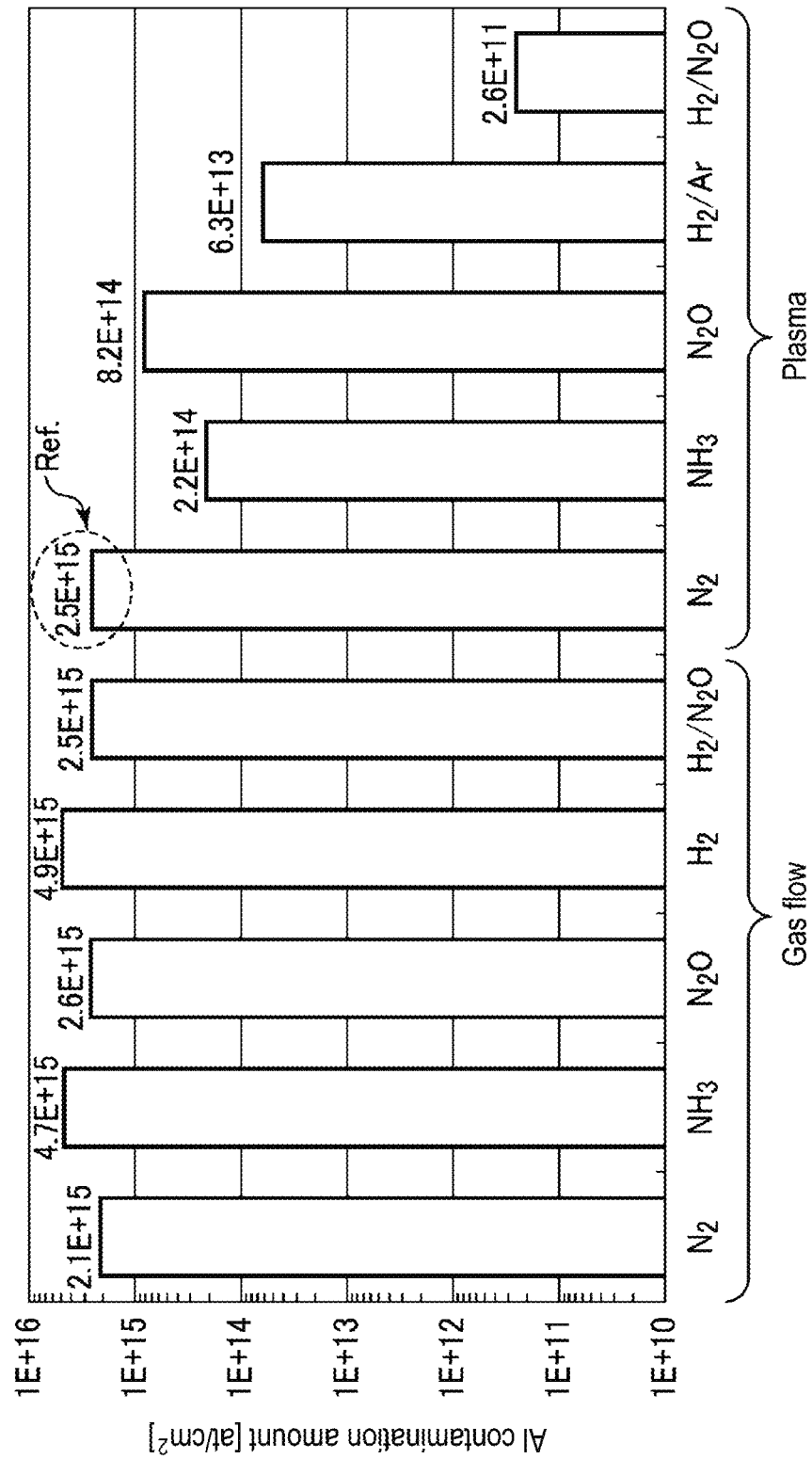
FIG. 7 is a diagram showing an Al contamination amount of a monitor substrate in a case where a process in which each gas of a $N_2$ gas, a $NH_3$ gas, a $N_2O$ gas, a $H_2$ gas, and a $H_2/N_2O$ mixed gas merely flows and a post-process with plasma of each of these gases were performed.

The results are shown in FIG. 7. FIG. 7 is a diagram showing an Al contamination amount when the gas flow of each gas or plasma was used. As shown in this figure, the Al contamination amount did not decrease in any of the gases merely by the gas flow. In addition, when the plasma was used, the Al contamination amount in the $NH_3$ gas, the $N_2O$ gas, and the $H_2$ gas was merely reduced slightly, but the Al contamination amount in the $H_2/N_2O$ mixed gas was greatly reduced at two orders or more. From this, it was confirmed that the sublimation of $AlF_3$ generated on the front surface of the stage 11 can be suppressed by performing the post-process with plasma of the $H_2/N_2O$ mixed gas which is an O- and H-containing gas.

Figure 8:
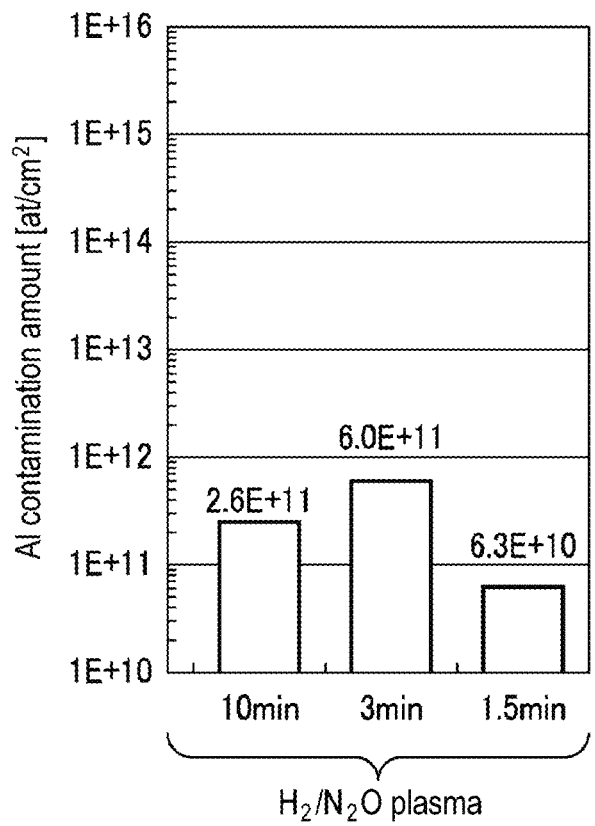
FIG. 8 is a diagram showing the Al contamination amount of the monitor substrate when the plasma of the $H_2/N_2O$ mixed gas was used in a post-process and a processing time was shortened to 3 min and 1.5 min.

Next, for the post-process using the plasma of the $H_2/N_2O$ mixed gas that was effective, an experiment was conducted in which the processing time was further shortened to 3 min and 1.5 min. The results are shown in FIG. 8. As shown in this figure, it was confirmed that the effect is obtained even if the post-process time is further shortened to 3 min and 1.5 min.

The plasma processing of the $H_2/N_2O$ mixed gas, which was confirmed to be able to suppress the sublimation of $AlF_x$ in the above-described experiments, was conducted in more detail. Here, three substrates (wafers) to each of which an $AlF_x$ film is attached were prepared. Inside the processing container of the film forming apparatus having the configuration illustrated in FIG. 1, Process A, Process B, and Process B' (to be described later) were performed on the three substrates in the state in which the pressure is set to 16 Pa and the stage temperature is set to 450 degrees C. Process A is a process performed as a reference in which an Ar gas flow (flow rate: 110 sccm) was performed for 90 sec. In Process B, the plasma processing (power: center/peripheral=250/550 W) of the $H_2/N_2O$ mixed gas (flow rate: $H_2/N_2O$=100/200 sccm) was performed for 90 seconds. In Process B', the time of the plasma processing similar to that in Process B was set to 180 sec.

Figure 9:
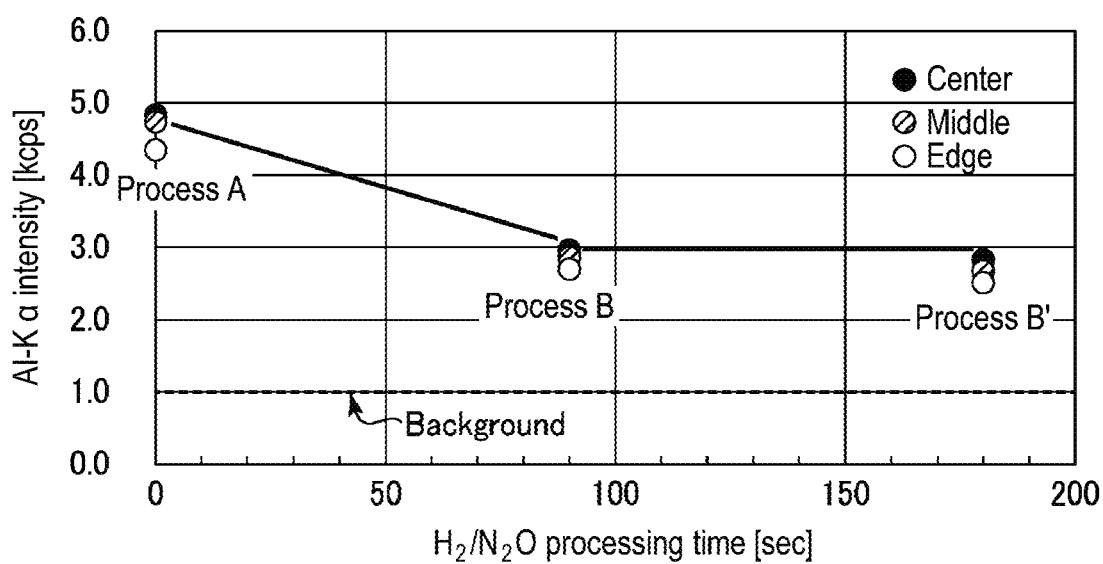
FIG. 9 is a diagram showing Al detection intensities of substrates after performing Process A in which gas flow with an Ar gas was performed as a post-process and processes B and B' in which the processing time was changed by using the plasma of the $H_2/N_2O$ mixed gas.

The results are shown in FIG. 9. FIG. 9 is a diagram showing intensities (Al detection intensities) of Al—Kα rays by X-ray fluorescence (XRF) analysis on the substrates after Process A, Process B, and Process B' were performed. As shown in this figure, the Al detection intensities were reduced in Process B and Process B' in which a process with the plasma of the $H_2/N_2O$ mixed gas was performed. Thus, the results suggesting that the AlF generated on the surface of the stage 11 was removed by the plasma of the $H_2/N_2O$ mixed gas which is an O- and H-containing gas were obtained. However, although the processing time was different between Process B and Process B', there was almost no difference in the Al detection intensities. For this reason, an additional analysis was performed by SEM and SEM-EDX.

Figure 10:
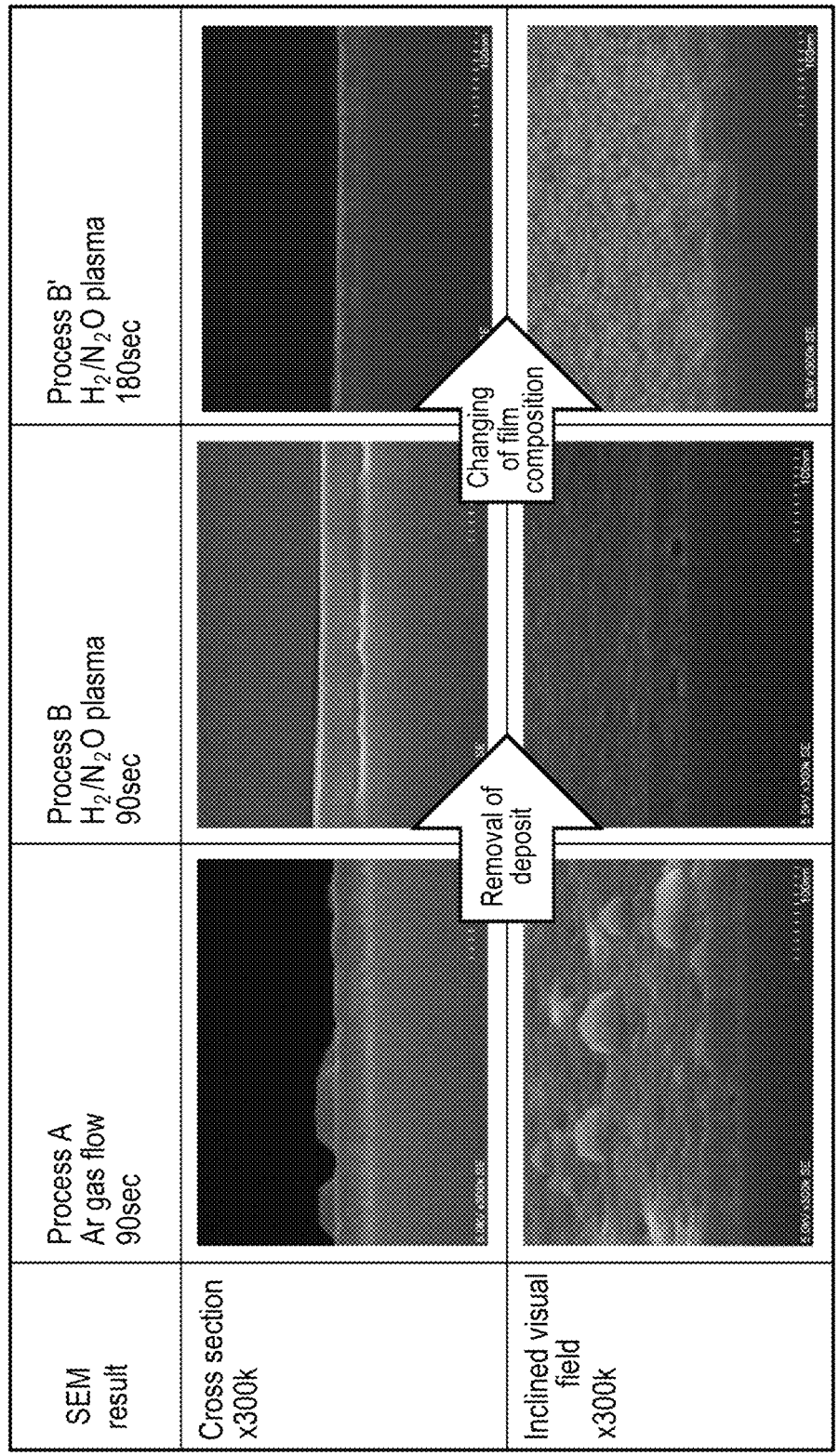
FIG. 10 is a view showing SEM photographs of substrates after performing Process A, Process B, and Process B' as post-processes.
Figure 11:
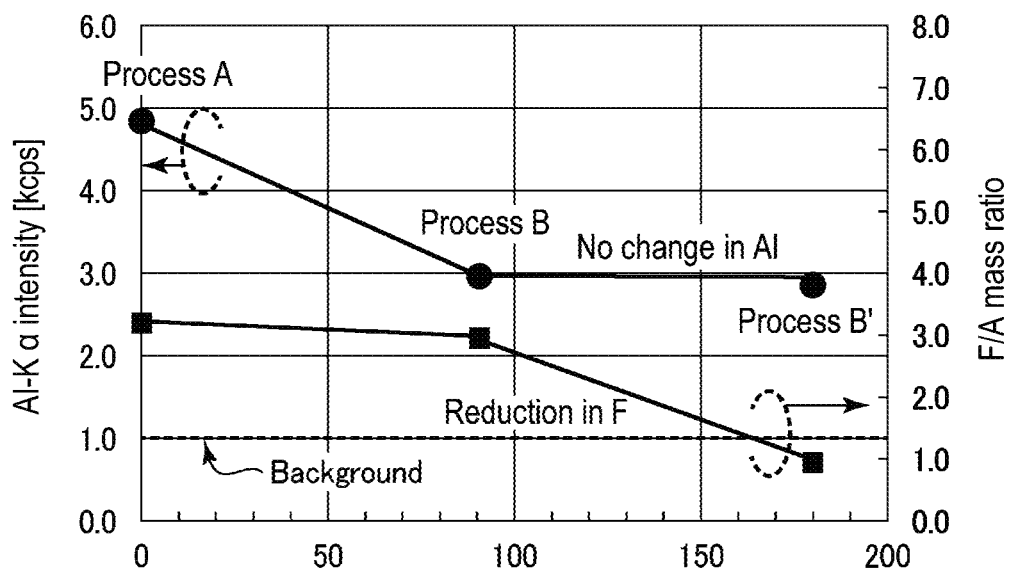
FIG. 11 is a diagram showing Al detection intensities by XRF and F/Al mass ratios by SEM-EDX of substrates after performing Process A, Process B, and Process B' as post-processes.

FIG. 10 shows SEM photographs of the substrates after performing Process A, Process B, and Process B'. In addition, FIG. 11 is a diagram showing Al detection intensities by XRF and F/Al mass ratios by SEM-EDX of the substrates after performing Process A, Process B, and Process B'. From the SEM photographs of FIG. 10, it can be seen that the deposit on the front of the substrate is removed through the plasma processing with the $H_2/N_2O$ gas in Process B, and correspondingly, in FIG. 11, it can be seen that, in Process B, a portion of $AlF_x$ is removed by Process B since the Al detection intensity is reduced and the F/Al mass ratio is not changed. Meanwhile, by Process B' in which the plasma processing time was prolonged to 180 sec, the state of the front surface was changed in the SEM photograph of FIG. 10, and the Al detection intensity was not changed in FIG. 11, but the F/Al mass ratio by EDX was reduced (that is, the concentration of F is reduced). This result suggests that the film has been modified. That is, it is considered that, by the post-process by the plasma of the $H_2/O_2$ mixed gas which is an O- and H-containing gas, a portion of $AlF_x$ is removed in the initial stage, but F is removed from the remaining $AlF_x$ over time, whereby $AlF_x$ is modified into a stable Al compound.

Subsequently, a simulation of the removal reaction of $AlF_3$ by the plasma of the O- and H-containing gas as described above was performed. Here, the Gibbs free energy change (ΔG) before and after the reaction was calculated by using simulation software for an assumed reaction model. When ΔG of the reaction is a negative value, the reaction is in a stable direction, and the reaction can proceed.

First, when the above-mentioned mixed gas of the $H_2$ gas and the $N_2O$ gas is used as the O- and H-containing gas, as a result of the simulation, the following reaction models of formulas (1) and (2) and formulas (3) and (4) are assumed, and ΔG showed a negative value in each reaction. That is, it was confirmed that the reactions of these reaction models can actually occur.

$$AlF_3(s)+3N_2O(g)+3H_2(g)$$

$$=Al(OH)_3(s)+3HF(g)+3N_2(g) \quad (1)$$

$$=Al(OH)_3(g)+3HF(g)+3N_2(g) \quad (2)$$

The reaction of formula (1) is a reaction in which $Al(OH)_3$ is generated as a reaction product. In formula (2), $Al(OH)_3$ (s) is turned into $Al(OH)_3$ (g), sublimated, and exhausted together with HF (g) and $N_2$ (g).

$$2AlF_3(s)+3N_2O(g)+12H_2(g)$$

$$=6NH_4F(s)+Al_2O_3(s) \quad (3)$$

$$=6NH_3(g)+6HF(g)+Al_2O_3(s) \quad (4)$$

The reaction of formula (3) is a reaction in which $NH_4F$ and $Al_2O_3$ are generated as reaction products. In formula (4), $NH_4F$ (s) of formula (3) is thermally decomposed, turned into $NH_3$ and HF, sublimated, and exhausted.

The above reaction models show that a reaction in which $AlF_3$ is modified into a stable Al compound occurs, and support the above-mentioned experimental results.

In reaction models of the following formulas (5) to (8) obtained by replacing $N_2O$ of the reaction models of the above-mentioned formulas (1) to (4) with $O_2$ and $N_2$, ΔG also has a negative value. Thus, the reaction models of the following formulas (5) to (8) are reactions that can actually occur.

$$2AlF_3(s)+6N_2(g)+3O_2(g)+6H_2(g)$$

$$=2Al(OH)_3(s)+6HF(g)+6N_2(g) \quad (5)$$

$$=2Al(OH)_3(g)+6HF(g)+6N_2(g) \quad (6)$$

$$4AlF_3(s)+6N_2(g)+3O_2(g)+24H_2(g)$$

$$=12NH_4F(s)+2Al_2O_3 \quad (7)$$

$$=12NH_3(g)+12HF(g)+2Al_2O_3(s) \quad (8)$$

In addition, when the mixed gas of the $H_2$ gas and the $O_2$ gas is used as the O- and H-containing gas, as a result of the simulation, ΔG becomes a negative value in the reaction models of the following formulas (9) and (10). Thus, it has been confirmed that the reaction models are reactions that can actually occur.

$$2AlF_3(s)+3O_2(g)+6H_2(g)$$

$$=2Al(OH)_3(s)+6HF(g) \quad (9)$$

$$=2Al(OH)_3(g)+6HF(g) \quad (10)$$

The reaction of formula (9) is a reaction in which $Al(OH)_3$ is generated as a reaction product, and in formula (10), $Al(OH)_3$ (s) is turned into $Al(OH)_3$ (g), sublimated, and exhausted together with HF (g).

The above reaction models of formulas (5) to (10) show that, when plasma processing is performed by using the mixed gas of the $N_2$ gas, the $H_2$ gas, and the $O_2$ gas, and the mixed gas of the $H_2$ gas and the $O_2$ gas as the O- and H-containing gas, $AlF_3$ is modified into a stable Al compound as in the case of using the mixed gas of the $H_2$ gas and the $N_2O$ gas.

Next, an experiment confirming the effect of the post-process by plasma of the O- and H-containing gas will be described.

Here, as an example, the film thickness shift was determined by using the film forming apparatus illustrated in FIG. 1, and by setting the stage temperature to 550 degrees C., and repeatedly performing the pre-coating process inside the processing container, the film formation of the SiN film on the substrate W, the cleaning process with the $NF_3$ gas excited by plasma, and the post-process with plasma of $H_2/N_2O$. In addition, as a comparative example, the film thickness shift was determined by performing the process in the same manner as in the example except that the post-process with plasma was not performed. The film thickness shift was determined based on the ratio between the edge film thickness and the center film thickness of the substrate (wafer) (the edge film thickness/center film thickness).

Figure 12:
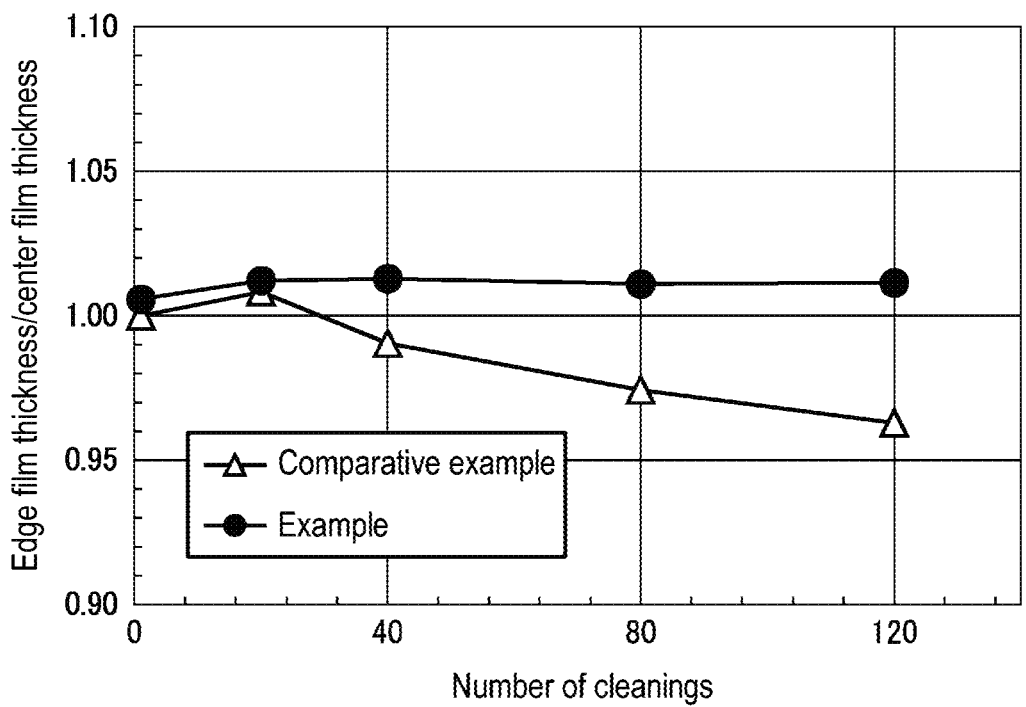
FIG. 12 is a diagram showing a relationship between the number of cleanings and an edge film thickness/center film thickness in an example and a comparative example.

The results are shown in FIG. 12. FIG. 12 is a diagram showing a relationship between the number of cleanings on the horizontal axis and the edge film thickness/center film thickness on the vertical axis. As shown in this figure, in the comparative example in which the post-process with plasma was not performed, as the number of cleanings increases, the edge film thickness/center film thickness tended to decrease, and the film thickness shift was observed. In contrast, in the case of the example, the value of the edge film thickness/center film thickness was maintained at almost 1 even when the number of cleanings increases, and no film thickness shift was observed. From this, it was confirmed that the film thickness shift can be suppressed by performing the post-process with plasma of the O- and H-containing gas.

According to the present disclosure, there is provided a film forming method and a film forming apparatus which are capable of suppressing, when an interior of a processing container is cleaned with a fluorine-containing gas after a film forming process, an influence on the formation of a film of an aluminum fluoride generated by a reaction between the fluorine-containing gas as a cleaning gas and a stage in which aluminum is contained.

OTHER APPLICATIONS

Although embodiments have been described above, it should be considered that the embodiments disclosed herein are exemplary in all respect and are not restrictive. The above embodiments may be omitted, replaced, or modified in various forms without departing from the scope and gist of the appended claims.

For example, in the above embodiments, as a film forming apparatus for performing a film forming process, the apparatus that forms a film by using the surface wave plasma generated by radiating microwaves from a plurality of microwave introduction parts into the processing container has been exemplified, but the present disclosure is not limited thereto. The number of microwave introduction parts may be one. Further, the plasma processing is not limited to that radiating microwaves for generating plasma, and various other plasmas, such as capacitively coupled plasma (CCP), inductively coupled plasma (ICP), electron cyclotron resonance (ECR) plasma, and the like, may be used. The film forming apparatus may be a thermal CVD apparatus or the like that does not uses plasma.

In the above-described embodiments, a Si-containing film such as a SiN film is mainly exemplified as the film to be formed, but the present disclosure is not limited thereto. As described above, another film such as a Ti-based film or a carbon film may be formed. Further, in the above-described embodiments, an example in which the $NF_3$ gas is excited by plasma as the cleaning gas has been illustrated, but as described above, another fluorine-containing gas such as a $F_2$ gas, a CF-based gas, a $ClF_3$ gas or the like may also be used. An appropriate cleaning gas may be used depending on a film to be formed. For example, in the case of a Si-containing gas such as SiN, a $NF_3$ gas excited by plasma may be preferably used, in the case of a Ti-based film, a $F_2$ gas or a $ClF_3$ gas may be appropriately used, and in the case of a carbon film, a CF-based gas such as a $CF_4$ gas may be appropriately used.

What is claimed is:

1. A film forming method of forming a film on a substrate by using a film forming apparatus including a processing container, and a stage provided in an interior of the processing container to place the substrate thereon and in which aluminum is contained, the film forming method comprising:
   forming a film continuously on one substrate or on a plurality of substrates by supplying a gas for film formation to the interior of the processing container while heating the substrate placed on the stage;
   cleaning the interior of the processing container with a fluorine-containing gas in a state in which the substrate is unloaded from the processing container; and
   performing a post-process by generating plasma of an oxygen- and hydrogen-containing gas in the interior of the processing container,
   wherein the forming the film, the cleaning the interior of the processing container, and the performing the post-process are repeatedly performed,
   wherein, in the cleaning the interior of the processing container, the fluorine-containing gas and the aluminum contained in the stage react with each other to generate an aluminum fluoride, and in the performing the post-process, at least one of $Al(OH)_3$ or $Al_2O_3$ is generated as a reaction product by a reaction between the aluminum fluoride and the plasma of the oxygen- and hydrogen-containing gas, and
   wherein the oxygen- and hydrogen-containing gas includes a mixed gas of a $N_2O$ gas and a $H_2$ gas.

2. The film forming method of claim 1, wherein the forming the film is performed by setting a temperature of the stage to 500 degrees C. or higher.

3. The film forming method of claim 1, wherein the forming the film includes forming a Si-containing film.

4. The film forming method of claim 3, wherein the Si-containing film is a SiN film.

5. The film forming method of claim 1, wherein the forming the film is performed by generating plasma of the gas for film formation.

6. The film forming method of claim 5, wherein the plasma is microwave plasma.

7. The film forming method of claim 1, wherein, in the cleaning the interior of the processing container, a $NF_3$ gas excited by plasma is used as the fluorine-containing gas.

8. A film forming method of forming a film on a substrate by using a film forming apparatus including a processing container, and a stage provided in an interior of the processing container to place the substrate thereon and in which aluminum is contained, the film forming method comprising:
   forming a silicon nitride film continuously on one substrate or a plurality of substrates by supplying a Si-containing gas and a nitrogen-containing gas to the interior of the processing container while heating the substrate placed on the stage to a temperature of 500 degrees C. or higher, and generating plasma of the Si-containing gas and the nitrogen-containing gas;
   cleaning the interior of the processing container by a $NF_3$ gas excited by the plasma in a state in which the substrate is unloaded from the processing container; and
   performing a post-process by generating plasma of an oxygen- and hydrogen-containing gas in the interior of the processing container,
   wherein the forming the silicon nitride film, the cleaning the interior of the processing container, and the performing the post-process are repeatedly performed,
   wherein, in the cleaning the interior of the processing container, the $NF_3$ gas and the aluminum contained in the stage react with each other to generate an aluminum fluoride, and in the performing the post-process, at least one of $Al(OH)_3$ or $Al_2O_3$ is generated as a reaction product by a reaction between the aluminum fluoride and the plasma of the oxygen- and hydrogen-containing gas, and
   wherein the oxygen- and hydrogen-containing gas includes a mixed gas of a $N_2O$ gas and a $H_2$ gas.

9. The film forming method of claim 8, wherein the plasma in the forming the film is microwave plasma.

10. The film forming method of claim 8, further comprising:
    pre-coating, on an inner wall of the processing container and a surface of the stage, a film of a material that is same as a material of the film to be formed on the substrate or a film containing a component of the film to be formed on the substrate, prior to the forming the film.

11. The film forming method of claim 8, wherein, in the cleaning the interior of the processing container, a temperature of the stage is equal to or lower than a temperature in the forming the film.

12. The film forming method of claim 11, wherein, in the cleaning the interior of the processing container, the temperature of the stage is 100 to 600 degrees C.

13. The film forming method of claim 8, wherein, in the performing the post-process, a temperature of the stage is equal to or lower than a temperature in the forming the film.

14. The film forming method of claim 13, wherein, in the performing the post-process, the temperature of the stage is equal to a temperature in the cleaning the interior of the processing container.

15. The film forming method of claim 8, wherein the stage is made of an aluminum nitride.

* * * * *